(12) United States Patent
Mirafzal et al.

(10) Patent No.: US 8,373,952 B2
(45) Date of Patent: Feb. 12, 2013

(54) INTEGRATED DC LINK INDUCTOR AND COMMON MODE CURRENT SENSOR WINDING

(75) Inventors: Behrooz Mirafzal, Grafton, WI (US); Craig Winterhalter, Cedarburg, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1171 days.

(21) Appl. No.: 11/541,623

(22) Filed: Sep. 29, 2006

(65) Prior Publication Data

US 2008/0080106 A1    Apr. 3, 2008

(51) Int. Cl.
*H02H 3/00* (2006.01)
(52) U.S. Cl. .......................................................... 361/45
(58) Field of Classification Search .................... 361/42, 361/45
See application file for complete search history.

(56) References Cited

U.S. PATENT DOCUMENTS

| | | | | |
|---|---|---|---|---|
| 4,318,151 A * | 3/1982 | Balchin | ............................ | 361/45 |
| 5,335,163 A * | 8/1994 | Seiersen | ........................ | 363/126 |
| 5,694,014 A * | 12/1997 | Hegg et al. | ..................... | 318/564 |
| 6,614,218 B1 * | 9/2003 | Ray | ............................ | 324/117 R |
| 6,898,092 B2 * | 5/2005 | Briere et al. | ..................... | 363/39 |
| 7,132,812 B1 * | 11/2006 | Wu et al. | ........................ | 318/448 |
| 2004/0207463 A1 * | 10/2004 | Pelly | .............................. | 327/552 |
| 2005/0259371 A1 * | 11/2005 | Henze et al. | ..................... | 361/44 |

* cited by examiner

*Primary Examiner* — Rexford N Barnie
*Assistant Examiner* — Christopher Clark
(74) *Attorney, Agent, or Firm* — Fletcher Yoder, P.C.; Alexander R. Kuszewski; John M. Miller

(57) ABSTRACT

An integrated DC link inductor and current sensor winding having a core that includes at least two primary legs and at least one secondary leg, two direct current (DC) link windings each wound around one of the two primary legs, and a common mode current sensor winding wound around the secondary leg. Resistors coupled to the common mode current sensor winding may damp the common mode current oscillations.

22 Claims, 4 Drawing Sheets

INTEGRATED DC LINK INDUCTOR AND COMMON MODE CURRENT SENSOR WINDING

BACKGROUND

The invention relates generally to filtering and sensing within a power converter. Particularly, this invention relates to a DC link inductor that is integrated with a sensor winding.

A DC link or bus in a power converter conducts DC power that the power converter converts into AC power at a desired frequency, which may be applied to drive an electric motor, among other things. A DC link inductor often includes a variety of windings or coils for performing various sensing and control functions. For example, a DC link may include a pair of inductors on each primary current path, and one or more windings to detect ground faults. The inductors on the primary current paths filter and smooth the primary DC currents, and the windings for detecting ground faults typically sense the relative magnitude of currents on the primary current paths. To identify a ground fault, the currents from each path are compared, and a determination is made whether the same amount of current is flowing into a load connected to the DC link as is flowing out of the load. If substantially more current flows into a load than out of a load, a ground fault may have occurred.

Unfortunately, the large number of discrete windings in traditional DC links can have undesirable effects. For example, the inductors often include large, heavy cores that can increase the size and weight of a DC link. Having several discrete inductors in a DC link may amplify the impact of these devices on the total size and weight of the DC link, thereby potentially increasing material, shipping, and storage costs.

There is a current need in the art, therefore, for an improved DC link.

BRIEF DESCRIPTION

Certain embodiments of the present technique provide for a DC link that addresses some of the abovementioned needs in the art. Some of the subsequently discussed embodiments are applicable to a wide variety of applications, such as an AC motor drive system or a power generation system. As explained below, certain embodiments may include an integrated DC link inductor and current sensor coil that share a common core. Such embodiments may tend to reduce the weight and size of an AC motor drive and, in some instances, reduce electromagnetic emissions arising from common mode currents relative to conventional systems.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
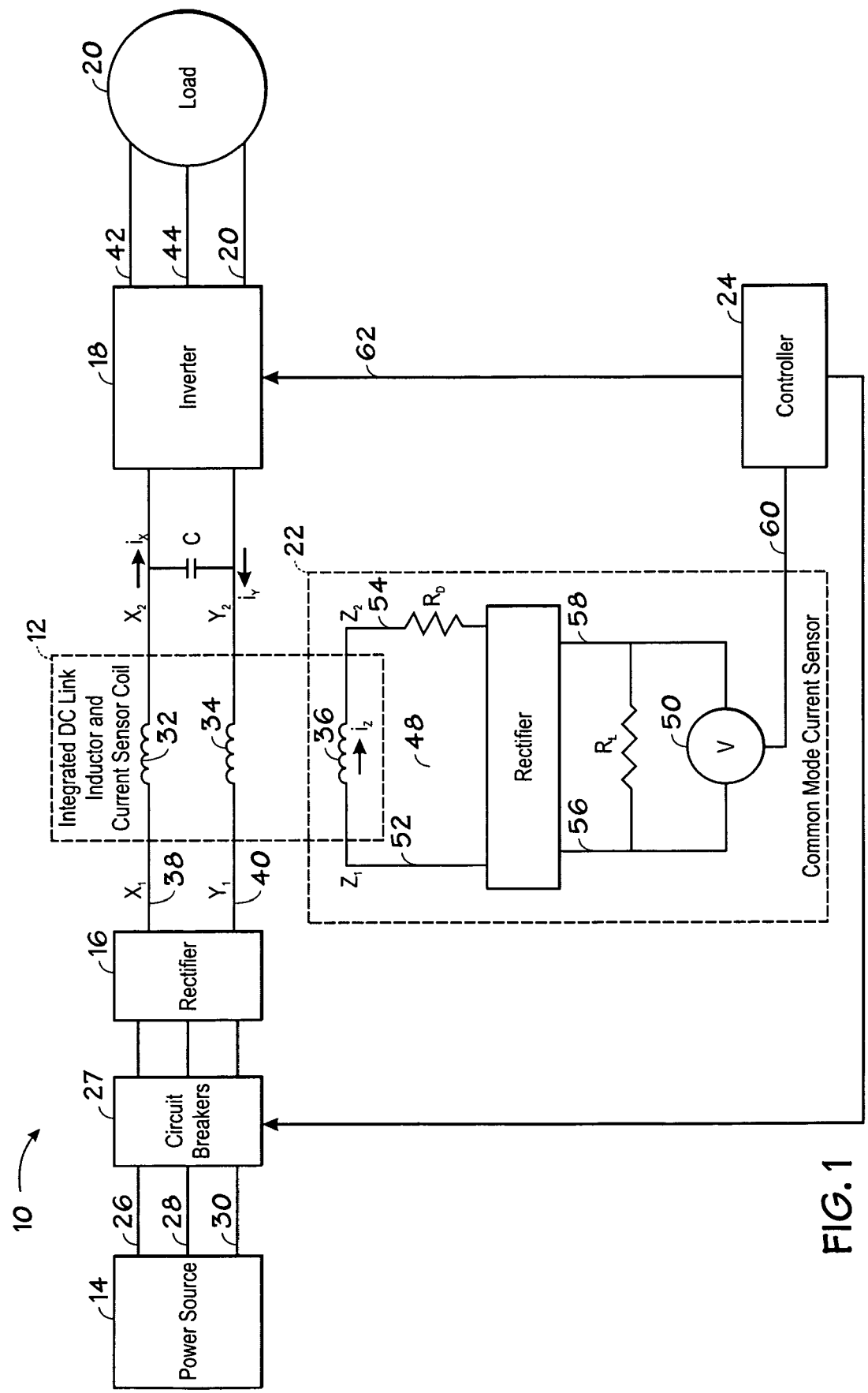
FIG. 1 illustrates an exemplary AC drive system in accordance with an embodiment of the present technique.

As discussed above, in electric motor drives, a motor is connected to a drive, which provides electrical power to the motor in a controlled manner. The motor drive systems are commonly employed to provide speed control or torque control. For AC motors, electrical power is converted in the drive from AC power supply, typically from utility, into DC voltage (and current). The DC power is then converted, using an inverter, into AC power in which the frequency and amplitude can be controlled, thereby controlling the motor speed and torque. Often, control is achieved by using pulse-width modulation (PWM) techniques. In many AC motor drive systems, there are three main subsystems: a rectifier (e.g., an AC to DC converter), a DC link filter, and an inverter (e.g., DC to AC converter). The AC motor drives are mainly in two general forms; current source inverter (CSI), and voltage source inverter (VSI). The main difference between the power circuits of these two types of drives is in their DC link filters. The inductance value of the dc link choke in the CSI drives is relatively large in comparison with the VSI drives. While the DC link inductor regulates the DC link current in the CSI drives, the DC link inductor in the VSI drives (in conjunction with the DC link capacitors) filter the DC bus voltage.

In VSI-based drives, the DC link inductor is typically divided into two individual windings located in the positive and negative links that connect the drive's rectifier to its inverter. The main reason is to so that the common mode current (or the drive leakage current) flows through an inductive element that limits the current step changes. A DC link or bus for a motor drive provides DC power that the drive converts into AC power at a desired frequency that is applied to drive an electric motor. A DC link for an AC motor drive may include a variety of windings or coils for performing various sensing and control functions. For example, a DC link may include a pair of inductors on each primary current path, and one or more windings to detect ground faults. The inductors on the primary current paths filter and smooth the primary DC currents, and the windings for detecting ground faults typically sense the relative magnitude of currents on the primary current paths. If the positive and negative paths of the DC link do not carry the same amount of current at any instance, the difference in these currents leaks into the ground. If substantially more current flows into a load (through the positive path) than out of a load (through the negative path), a ground fault may have occurred. To identify a ground fault, the currents from each path are compared, and a determination is made whether the same amount of current is flowing into a load (through the positive path) connected to the DC link as is flowing out of the load (through the positive path). In other words, if the common mode current exceeds a predetermined value, a fault alarm is activated. The ground fault detection can be performed by adding a third winding to the DC link, positive and negative current paths, in a manner that the third winding senses the common mode currents.

In pulse-width modulation (PWM) based drives; a common mode voltage with relatively large step changes is produced by the drive's PWM inverter. This fast switching voltage may result in a non-negligible amount of high frequency leakage (common mode) current that flows through stray (parasitic) capacitors between motor stator windings and motor frame and also between the power lines of the motor feeder cable and its ground wire and/or cable shield. The peak value of the leakage current may even reach the rated current in the worst case. It may have an undesirable influence on the motor current control. Moreover, the leakage current may cause electromagnetic interference (EMI) to electronic equipments which are close to the motor drive system.

A common mode inductor (choke) may be used to reduce the undesirable leakage current, which is connected in series between the output terminals of the drive and those of the motor. The connection of conventional common mode choke is not effective to reduce the rms (root-mean-square) value of the leakage current, but effectively reduces the peak current values. However, the third winding in this invention (integrated DC link inductor) is loaded by a resistor to damp the oscillation of the leakage (or common mode) current, which consequently tends to reduce the electromagnetic interference (EMI) or noise caused by high frequency oscillations on the common mode (or leakage) current.

As discussed below, certain embodiments of the invention may provide an integrated DC link inductor (choke) for AC motor drive systems or power conversion systems. This integrated DC link may consist of three windings (coils) which are wound around two primary (or outer) legs and a secondary (or inner) leg. The two outer legs' windings may be used to suppress both the differential mode and common mode currents, while the inner leg's winding may be electrically loaded by two resistors in series. While the aggregate value of these resistors may tend to improve the damping impact for the common mode current, the voltage drop across one of the resistors may, in certain embodiments, be used for sensing the level of common model current as well as detecting a ground fault. In certain applications, the sensed common mode current may be employed for diagnosing (and/or predicting) a failure in an AC motor drive system.

Turning to the drawings, FIG. 1 depicts an exemplary AC drive system 10 that includes an integrated DC link inductor and current sensor winding 12 (hereinafter an "integrated ICSW"). As explained below, some embodiments of the integrated ICSW 12 may provide a variety of benefits, such as reducing the weight and size of the AC drive system 10 relative to a traditional system, and dampening electromagnetic emissions from common mode currents (or leakage currents) by increasing a damping factor for such currents. Prior to addressing the integrated ICSW 12 in detail, features of the surrounding AC drive system 10 will be discussed.

The AC drive system (or more generally, a power conversion system) 10 may be employed in a factory automation system, a traction system, an AC motor drive, a power generation system, or a power supply. The presently discussed AC drive system 10 includes a power source 14, a rectifier 16, an inverter 18, a load 20 (such as an electric motor), a current sensor 22, and a controller 24. As explained below, the AC drive system regulates power delivered to the load 20.

The illustrated power source 14 is a three-phase, alternating current (AC) power source. In some embodiments, the power source 14 may include or couple to grid power or a generator configured to deliver three phases of AC power. In other embodiments, the power source may output direct current power or a different number of phases of AC power, e.g., one or two-phase AC power. Three phase paths 26, 28, and 30 electrically couple (i.e., connect, either directly or indirectly in such a manner that electrons may flow therebetween) the power source 14 to the rectifier 16. The power source 14 may include contactors to stop currents flowing through one or more of these phase paths 26, 28, 30.

The illustrated rectifier 16 is a three-phase, full-wave rectifier. However, in other embodiments, the rectifier 16 may include a half-wave rectifier or, in some embodiments (such as those having a DC power source 14), the rectifier 16 may be omitted, which is not to suggest that any other feature discussed herein may not also be omitted.

In various embodiments, the integrated ICSW 12 may be alternatively referred to as a combination low pass filter and current sensor, an inductor/ground fault detector, or an integrated common mode current sensor and DC link inductor, for instance. The illustrated integrated ICSW 12 has two inductors 32 and 34 and a current sensor winding 36. As explained further below in reference to FIG. 2, the current sensor winding 36 of the illustrated embodiment shares a magnetic core with the inductors 32 and 34, thereby potentially reducing the size and weight of the integrated ICSW relative to a DC link having discrete cores. The inductors 32 and 34 may be coupled to the rectifier 16 and the inverter 18 by a pair of current paths 38 and 40, with an inductor 32 or 34 serially disposed on each current path 38 and 40 between the rectifier 16 and the inverter 18. The current paths 38 and 40 may be referred to as positive and negative current paths. Additionally, a capacitor C connects to both current paths 38 and 40 to form a second order low pass filter with the inductors 32 and 34. Ripples in the currents on current paths 38 and 40 may be reduced by the combined transient effects of the inductors 32 and 34 and the capacitor C. The inductance value of the DC link inductor (differential mode) may be selected such that the cut off frequency of the low pass filter is less than 120 Hz. This is because a 120 Hz voltage component can be generated by an unbalance power source (utility).

The inverter 18 may be configured to receive DC power and output AC power having an appropriate frequency and waveform. For example, the inverter 18 may include various solid state switching devices, such as integrated gate bipolar junction transistors, solid state relays, transistors, solenoids, and/or various types of electromechanical inverter switches, and the like. In some embodiments, the inverter 18 may include circuitry adapted to pulse width modulate an output AC waveform. The inverter 18 may be configured to output single-phase AC power, two-phase AC power, three-phase AC power, or other types of AC power. Alternatively, the inverter 18, like many of the other features discussed herein, may be omitted, and DC power may flow directly through the load 20. The inverter 18 of the illustrated embodiment couples to the load 20 via three phase paths 42, 44, and 46.

The illustrated load 20 is a synchronous AC motor with permanent magnets. However, other embodiments may include other types of motors, such as a stepper motor, an induction motor, a linear motor, or the like. The motor may couple to a variety of machines, such as a conveyor belt, a pump, a fan, a drive shaft, and/or a wheel, for instance. Alternatively, or additionally, the load 20 may include other electrical devices, such as a heating element, an inductive heating winding, an amplifier, an electrolysis bath, an energy storage device, a battery, and/or a capacitor, for example. In some embodiments, a plurality of loads may receive power from the inverter 18.

In the illustrated embodiment, a common mode current sensor 22 (hereinafter "CMCS") monitors aspects of the currents on the current paths 38 and 40, i.e., $i_X$ and $i_Y$ in FIG. 1. Specifically, as is explained further below, the CMCS 22 senses a difference in magnitude of currents on the current paths 38 and 40, such as might occur during a ground fault. The CMCS 12 of the presently discussed embodiment includes the current sensor winding 36, a rectifier 48, two resistors in series ($R_L+R_D$), and a voltmeter (e.g., a voltage sensor) 50. The resistor $R_D$ may be referred to as a damping resistor.

The rectifier 48 may include single-phase, half-wave or full-wave rectifier and, in some embodiments, a low pass filter to smooth output currents. Inputs 52 and 54 of the rectifier 50 couple to opposing sides of the current sensor winding 36, which may be electromagnetically coupled to the current paths 38 and 40 in the manner described below in reference to FIG. 2. Both the resistor $R_L$ and the voltmeter 50 may be coupled in parallel to outputs 56 and 58 of the rectifier 48.

Finally, in the currently discussed embodiment, the AC drive system 10 includes a controller 24. The controller 24 may include a variety of digital and/or analogue circuits configured to control the load 20 in response to, inter alia, signals from the CMCS 22. For example, the controller 24 may include a microprocessor, a central processing unit, an application specific integrated circuit, a digital signal processor, a microcontroller, or the like. A signal path 60 may carry signals indicative of common mode currents to the controller 24, and a signal path 62 may enable the controller 24 to communicate with the inverter 18. The controller 24 may also communicate with circuit breakers 27 on the phase paths 26, 28, and 30.

In certain embodiments, the controller 24 may be configured to perform a variety of functions. For instance, the controller 24 may be adapted to control the operation of the load 20 by modulating various aspects of the power delivered to the load 20, as described further below. Additionally, or alternatively, the controller 20 may be configured to regulate power delivered to the load 20 in response to a common mode current sensed by the CMCS 22. For instance, in some embodiments, the controller 24 may be configured to terminate the delivery of power to the load 20 in response to on a signal indicative of a ground fault from the CMCS 22 by signaling the circuit breaker 27 to open one or more phase paths 27, 28, and/or 30. To these ends, the controller 24 will typically include memory storing code or instructions for performing one or more of these functions among others.

In operation, the presently discussed AC drive system 10 delivers power to the load 20 in a controlled manner. For instance, in some embodiments, the amplitude, frequency, voltage, waveform shape, number of phases, and/or other parameter associated with the current that reaches the load 20 may be controlled by the AC drive system 10. As described below, these parameters may be modulated to control operation of the load 20.

In the present embodiment, the power supply 14 outputs three phases of AC power on phase paths 26, 28, 30. The AC power from the power supply 14 may be grid power of a standard frequency, such as 50 or 60 Hz. In certain embodiments, the power supply 14 may deliver a portion of each cycle of grid power to regulate the power delivered, for instance with a silicon controlled rectifier (SCR) or insulated gate bipolar transistor (IGBT).

The rectifier 16 rectifies and combines the currents on the three phase paths 26, 28, 30 to produce a DC current $i_X$ on current path 38 and a return DC current $i_Y$ on current path 40. The currents $i_X$ and $i_Y$ are generally equal under certain operating conditions, but they may be different if, for example, the load 20 and other components are leaking current to ground (e.g., during a ground fault). In other words, in certain systems, substantially all of the current flowing into the inverter 18 and load 20 (i.e., $i_X$) flows back out as current $i_Y$ absent a current leak. Herein, the currents $i_X$ and $i_Y$, which have different directions, are referred to as differential mode currents. A difference between the magnitude of $i_X$ and $i_Y$, which may indicate a net loss or gain of current on the two current paths 38 and 40, is referred to herein as a common mode current. A common mode current may occur during a ground fault, as some current $i_X$ flowing into the load 20 leaks to ground rather than flowing back out of the load as $i_Y$.

In the present embodiment, the integrated ICSW 12 performs two functions: reducing ripples in the primary currents $i_X$ and $i_Y$ and outputting a current $i_Z$ indicative of a change in the difference between $i_X$ and $i_Y$, as might occur during the onset of a ground fault. To perform the first function, the inductors 32 and 34 may combine with the capacitor C to form a low-pass filter, thereby potentially suppressing ripples or other rapid changes in the currents $i_X$ and $i_Y$. The second function, sensing a change in the difference between $i_X$ and $i_Y$, may be performed by the current sensor winding 36, which is electromagnetically coupled to the inductors 32 and 34 by a common core. As explained below in reference to FIG. 2, magnetic flux from each of the inductors 32 and 34 may cancel out in the vicinity of the current sensor winding 36 when the currents 32 and 34 are equal. When a difference between the magnitude of $i_X$ and $i_Y$ (i.e., a common mode current) arises, a resultant flux may occur within the current sensor winding 36, and the change in the resultant flux may induce a current $i_Z$. The current $i_Z$ may be monitored to detect a ground fault or, more generally, sense a common mode current. The dual functions of the presently discussed integrated ICSW 12 are described in more detail below in reference to an exemplary integrated ICSW 12 depicted by FIG. 2.

The inverter 18 of the present embodiment receives the rectified and filtered DC currents $i_X$ and $i_Y$ and forms three phases of AC current on phase paths 42, 44, and 46. The inverter 18 may form AC power by, for instance, selectively temporarily closing circuit paths coupling various combinations of the phase paths 42, 44, and 46 with the DC current paths 38 and 40. In some embodiments, the inverter 18 may shape the resulting waveforms by, for instance, pulse width modulation or other techniques.

Figure 2:
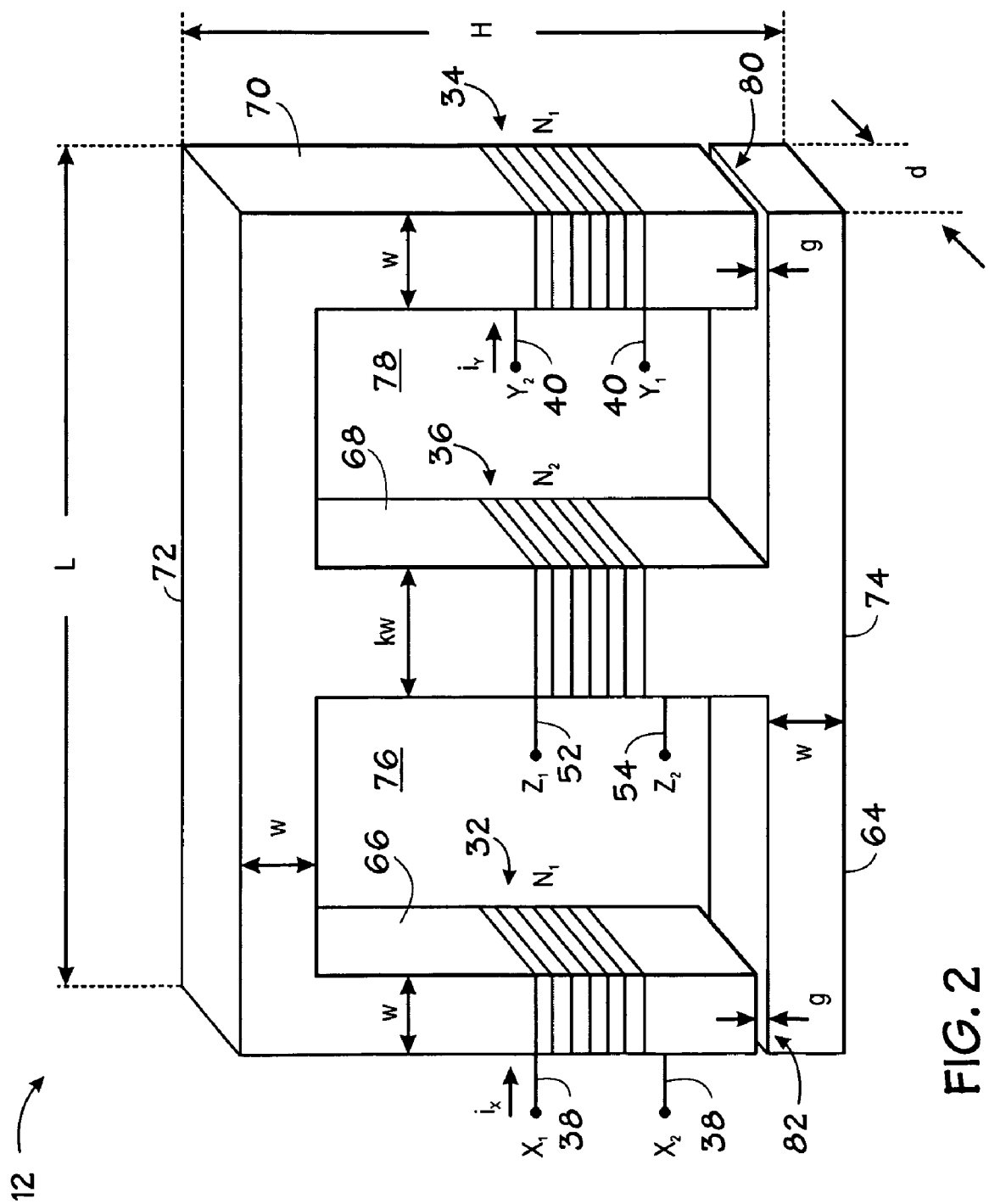
FIG. 2 illustrates an exemplary integrated DC link inductor and current sensor winding in accordance with an embodiment of the present technique.

FIG. 2 illustrates the exemplary integrated ICSW 12 in more detail. The integrated ICSW 12 of FIG. 2 includes an integrated or monolithic core 64, the two inductors 32 and 34, and the CMCS winding 36. The illustrated core 64 has three legs 66, 68, and 70 and two cross bars 72 and 74, which collectively define two apertures 76 and 78. The outer legs 66 and 70 may be referred to as primary legs, and the inner leg 68 may be referred to as a secondary leg. The core 64 has a length L, a perimeter width w, an inner leg width kw (where k<1 in the present embodiment), a depth d, and a height H. Appropriate values for these dimensions may be selected in light of the application and some of the considerations discussed below. Gaps 80 and 82 are disposed on the outer legs 66 and 70 where a distal end of each of the legs 66 and 70 approaches the bottom cross bar 74. In the present embodiment, the gaps 80 and 82 both have a generally uniform width g, and the outer legs 66 and 70 have a generally uniform cross-sectional area A in a plane parallel to the gaps g.

The illustrated inductors/windings 32, 34, and 36 are wrapped around the legs 66, 68, and 70, respectively. In the present embodiment, the windings 32 and 36 are a single layer of windings, which may tend to reduce parasitic capacitance between layers of windings. The illustrated windings 32 and 36 are wound in opposite directions, e.g., clockwise and counter-clockwise, respectively.

The operation of the integrated ICSW 12 is explained below with two approaches: first, by an explanation of the governing equations with reference to FIG. 2, and, later, by describing the flux in the core 64 with reference to FIG. 4.

As can be seen in FIG. 2, the windings 32 and 36 are connected in the integrated ICSW 12 of the AC drive system 10 in such a manner that their magneto motive forces, namely $N_1 i_X$ and $N_1 i_Y$ (where $N_1$ is the number of turns in the windings), produce flux in the same direction. In the present embodiment, both windings 32 and 36 have the same number of turns $N_1$. If currents in these windings are equal in magnitude, that is $i_X=i_Y$, then generally no flux penetrates into the inner leg 68. Accordingly, the total differential-mode inductance is approximately obtained by $(2N_1)^2/(2 g/(\mu.A))=(2N_1^2 \mu.A)/g$, assuming the core is not saturated (where $\mu$. is the permeability of free space). To avoid saturation, in some embodiments, the air-gap length g and the core cross-section area A are chosen such that, for a rated dc-link current $i_X$ and $i_Y$ and a given magnetic core material, the core flux density (B) is below the saturation value of flux density in the B-H curve (where H is the magnetic field strength).

If the current flowing through winding 32 $i_X$ is not equal to the current flowing through winding 34 $i_Y$ (as might happen during a ground fault), then the resulting common-mode magneto motive force, namely $N_1(i_X-i_Y)$, drops across one gap 80 or 82, and the resultant flux flows mainly through the winding 36. If the core 64 is not saturated due to the common-mode current, i.e., $(i_X-i_Y)$, and the winding 36 of the inner leg is open circuited (i.e., $R_L=\infty$) then the common mode inductance is approximately equal to $(N_1^2 \mu.A)/g$. To prevent core saturation due to normal levels of common-mode current, e.g., not during a ground fault, the current sensor winding 36 is loaded by the resistor $R_L$ through rectifier 48, as shown in FIG. 1. Accordingly, in some embodiments, the number of windings on the inner winding 36 ($N_2$) and $R_L$ are selected such that $N_2 i_Z - N_1 |i_X - i_Y|$ is small enough to prevent core saturation due to a normal level of common-mode currents. With the current sensor winding 36 loaded $R_L$, the resultant common-mode inductance is approximately equal to $((N_1^2 \mu.A/g)$ in parallel with $(N_1/N_2)^2 Z_L$, where $Z_L$ is the effective load impedance of the combination of the rectifier 48 and $(R_L+R_d)$.

Figure 3:
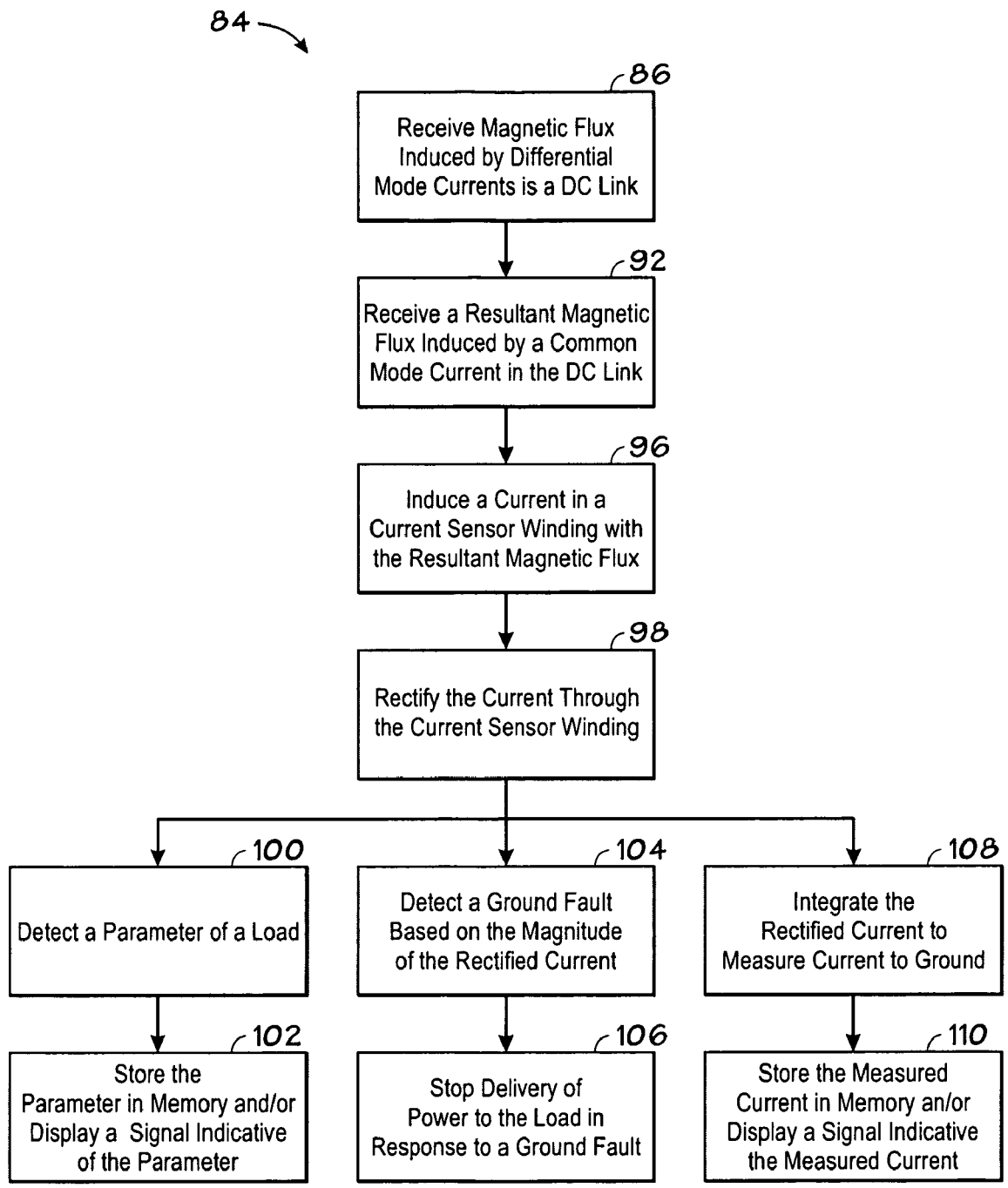
FIG. 3 depicts an exemplary filtering and monitoring process in accordance with an embodiment of the present technique.
Figure 4:
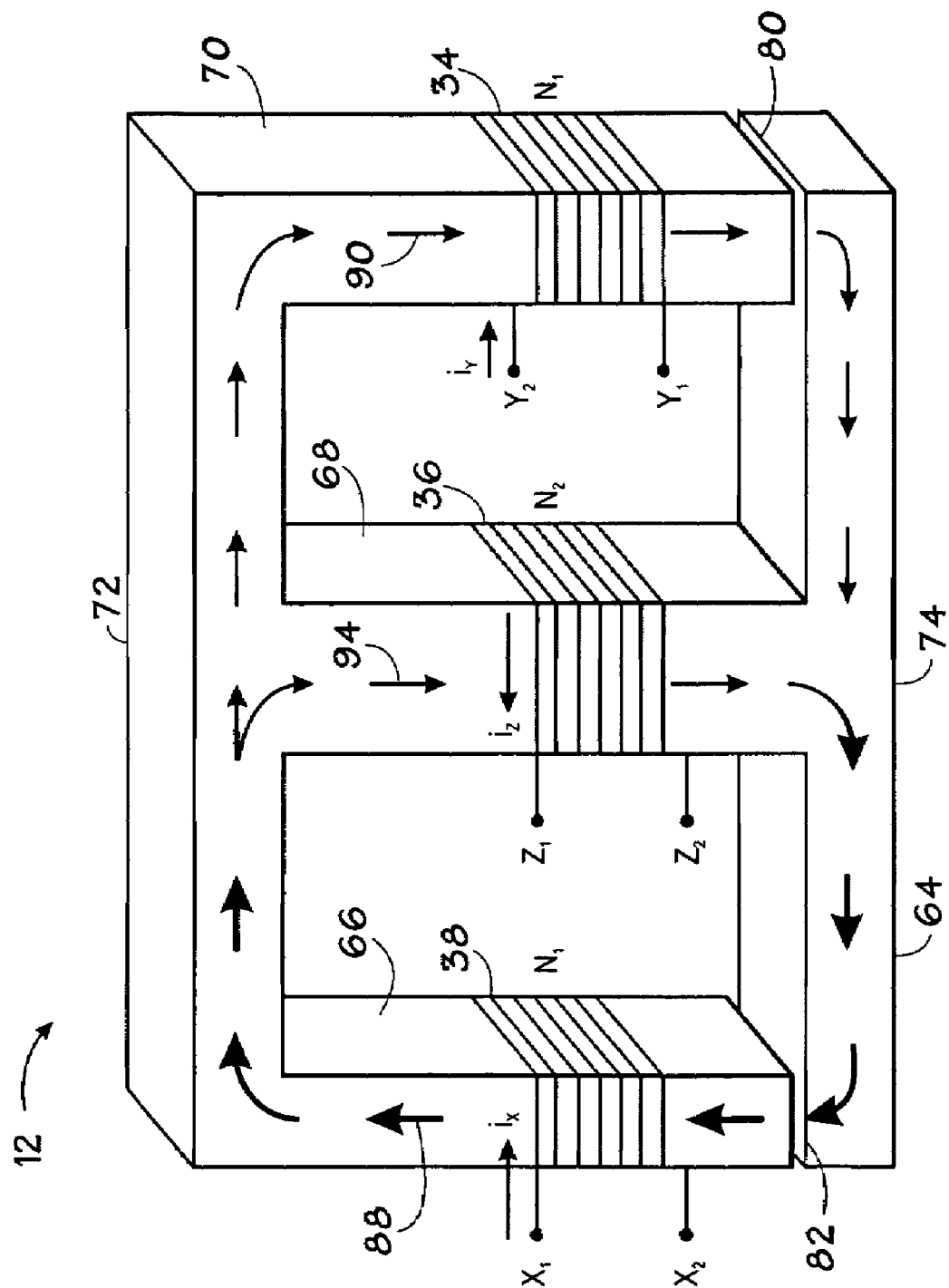
FIG. 4 illustrates magnetic flux in the integrated DC link inductor of FIG. 2 during the filtering and monitoring operation of FIG. 3.

The operation of the integrated ICSW 12 is depicted in greater detail by FIGS. 3 and 4. FIG. 3 is a flow chart of an exemplary filtering and sensing processes 84, and FIG. 4 depicts magnetic flux in the core 64 during the exemplary filtering and sensing process 84.

Turning to FIG. 3, the exemplary process 84 begins with receiving magnetic flux induced by differential mode currents in a core, as depicted by block 86. For instance, in FIG. 4, differential mode currents $i_X$ and $i_Y$ through the oppositely wound windings 32 and 34 induce such a magnetic flux in the core 64. FIG. 4 depicts a magnetic flux 88 induced by the current $i_X$ and a magnetic flux 90 induced by the current $i_Y$. The illustrated fluxes 90 and 88 have the same rotational direction, i.e., clockwise from the perspective of FIG. 4.

The exemplary process 84 further includes receiving magnetic flux induced by a common mode current in the core, as depicted by block 92 of FIG. 3. In FIG. 4, a resultant flux 94 in the middle leg 68 arises due to a difference between the flux 88 from the winding 38 and the flux 90 from the winding 34. If the number of winding revolutions $N_1$ is equal, the resultant flux 94 may correspond to the difference in magnitude of $i_X$ and $i_Y$. In FIG. 4, the magnitude of $i_X$ is larger than the magnitude of $i_Y$, and the resultant flux 94 flows in the same rotational direction as the flux 88 passing through the winding 38, which carries the larger current $i_X$. In other situations, $i_Y$ may be larger than $i_X$, and the resultant flux 94 may flow in the opposite direction, i.e., in the same rotational direction as the flux 90 passing through the winding 34 that carries the current $i_Y$. The magnitude of the resultant flux 94 may be proportional to the difference between the magnitude of currents $i_X$ and $i_Y$. In some applications, $i_X$ and $i_Y$ may be generally equal, e.g., in the absence of a ground fault, in which case the resultant flux 94 may be generally zero.

Returning to the process 84 of FIG. 3, a change in the resultant flux 94 may induce a current $i_Z$ in a current sensor winding 36, as depicted by block 96. As the resultant flux 94 increases or decreases, a current $i_Z$ is induced in the winding 36 of FIG. 4. The direction and magnitude of the current $i_Z$ may correspond with the direction and rate of change of the resultant flux 94. For example, during the onset of a ground fault, the current $i_Y$ returning from the load 20 may drop, thereby increasing the resultant flux 94 and inducing a current $i_Z$ in the winding 36. This current, $i_Z$, may be rectified, as depicted by block 98 of FIG. 3, and the voltage of the rectified current may be sensed, e.g., by the voltmeter 50 of FIG. 1.

In the present embodiment, the product of steps 86, 92, 96, and 98 is a signal indicative of the magnitude and direction of a common mode current on current paths 38 and 40. This signal has a variety of uses, as illustrated by the branches of the process 84. For example, a parameter of the load 20 may be detected, as depicted by block 100, and the parameter may be stored in memory or displayed, as depicted by block 102. The parameter might be an imbalance in a motor, e.g., extra windings, a short in a motor terminal, or other parameter that corresponds with a common mode current. In another example, a ground fault may be detected based on the magnitude of the rectified current $i_Z$, as depicted by block 104. In response, the controller 24 may stop the delivery of power to the load 20, as depicted by block 106. In yet another example, the rectified current $i_Z$ may be integrated, e.g., with a capacitor, to measure current to ground, as depicted by block 108. The magnitude of the measured current may be stored in memory or it may be displayed, as depicted by block 110.

While only certain features of the invention have been illustrated and described herein, many modifications and changes will occur to those skilled in the art. For example, the inductor can also be used in a DC/DC application or any application that can benefit from the integration of a power inductor (common and differential mode inductor) and a common mode sensor. It is, therefore, to be understood that the appended claims are intended to cover all such modifications and changes as fall within the true spirit of the invention.

The invention claimed is:

1. An apparatus, comprising
   a core having at least two primary legs and at least one secondary leg;
   two direct current (DC) link windings each wrapped around one of the two primary legs;
   a current sensor winding wrapped around the secondary leg, wherein the current sensor winding conducts a common mode current generated by a difference in currents flowing in different directions in the two DC link windings; and
   a rectifier, wherein the rectifier is configured to rectify the common mode current of the current sensor winding.

2. The apparatus of claim 1, wherein the two DC link windings are configured to substantially prevent magnetic flux of differential mode currents from penetrating the secondary leg.

3. The apparatus of claim 1, wherein the two primary legs each comprise a gap and the secondary leg does not have a gap.

4. The apparatus of claim 3, wherein the core is configured to conduct magnetic flux from the differential mode current through the gap in both of the primary legs and magnetic flux from a common mode current through the gap in one of the primary legs but not through the gap in the other primary leg.

5. The apparatus of claim 4, comprising:
   a damping resistor in series with the current sensor winding;

a second resistor in series with both the current sensor winding and the damping resistor; and
a ground fault detector coupled to the second resistor.

6. An apparatus, comprising
a core having at least two primary legs and at least one secondary leg, wherein the two primary legs each comprise a gap and the secondary leg does not have a gap;
two direct current (DC) link windings each wrapped around one of the two primary legs;
a current sensor winding wrapped around the secondary leg, wherein the current sensor winding conducts a common mode current generated by a difference in currents flowing in different directions in the two DC link windings, wherein the core is configured to conduct magnetic flux from the differential mode current through the gap in both of the primary legs and magnetic flux from a common mode current through the gap in one of the primary legs but not through the gap in the other primary leg;
a damping resistor in series with the current sensor winding;
a second resistor in series with both the current sensor winding and the damping resistor;
a ground fault detector coupled to the second resistor; and
a rectifier, wherein the second resistor is coupled to the current sensor winding through the rectifier.

7. The apparatus of claim 6, wherein the damping resistor is disposed in series with the current sensor winding and the rectifier.

8. The apparatus of claim 5, wherein the damping resistor is configured to increase the damping factor for common mode current and reduce electromagnetic emission.

9. A method, comprising:
receiving, in a core, magnetic flux induced by differential mode currents in a positive current path and a negative current path through a DC link, wherein current in the positive current path flows in a different direction from current in the negative current path;
receiving, in the core, resultant magnetic flux induced by a common mode current in the DC link, wherein the common mode current corresponds to a difference between magnitudes of the differential mode currents; and
sensing the resultant magnetic flux;
inducing a current in a common mode current sensor winding from the resultant magnetic flux; and
rectifying the current via a rectifier to generate a rectified current.

10. The method of claim 9, wherein the induced current is proportional to the common mode current in the DC link, and wherein the resultant magnetic flux is received in a secondary leg of the core.

11. The method of claim 10, comprising:
measuring the rectified current;
determining whether a ground fault has occurred based on the measurement; and
opening the positive current path, the negative current path, or both in response to a determination that a ground fault has occurred.

12. The method of claim 10, comprising determining a parameter of a load based on a direction of the resulting magnetic flux, a magnitude of the resulting magnetic flux, a rate of change of one or more of these parameters, or a combination thereof.

13. The method of claim 9, comprising:
conducting DC power that is flowing between a power supply and a load; and
sensing a ground fault.

14. The method of claim 13, comprising damping oscillations of the common mode current and suppressing electromagnetic interference.

15. A method, comprising:
disposing a pair of DC link inductor windings about a common core; and
disposing a winding of a common mode current sensor about the common core, wherein the current mode sensor monitors a rectified common mode current generated by rectifying a difference in currents flowing in different directions in the pair of DC link windings.

16. The method of claim 15, comprising coupling the winding of the common mode current sensor to a common mode current sensor, wherein the common mode current sensor comprises a ground fault detector.

17. The method of claim 15, wherein the common core comprises two primary legs about which the pair of DC link inductor windings are respectively disposed and a secondary leg about which the winding of the common mode current sensor is disposed.

18. The method of claim 15, comprising disposing the pair of DC link inductor windings in a power conversion system.

19. The method of claim 18, comprising coupling the power conversion system to an AC motor, a generator, or a combination thereof 20. The method of claim 15, wherein the common mode current sensor comprises a controller configured to detect a ground fault and open a current path that includes one of the DC link inductors in response to the ground fault.

21. The method of claim 9, comprising sensing by a current sensor comprising the rectifier, saturation of the core by the common mode current.

22. The method of claim 16, comprising coupling a rectifier, via a resistor, to the winding of the common mode current sensor to rectify the difference in currents flowing in different directions in the pair of DC link windings for preventing saturation of the core by a common mode current.

* * * * *